(12) United States Patent
Chen

(10) Patent No.: US 11,063,141 B1
(45) Date of Patent: Jul. 13, 2021

(54) INSULATED GATE FIELD EFFECT BIPOLAR TRANSISTOR AND MANUFACTURING METHOD THEREOF

(71) Applicant: Powerchip Semiconductor Manufacturing Corporation, Hsinchu (TW)

(72) Inventor: Chun-Sheng Chen, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/883,997

(22) Filed: May 26, 2020

(30) Foreign Application Priority Data

Apr. 22, 2020 (TW) ................................ 109113504

(51) Int. Cl.
| | |
|---|---|
| *H01L 29/739* | (2006.01) |
| *H01L 29/10* | (2006.01) |
| *H01L 29/08* | (2006.01) |
| *H01L 21/02* | (2006.01) |
| *H01L 29/417* | (2006.01) |
| *H01L 29/66* | (2006.01) |

(52) U.S. Cl.
CPC .... *H01L 29/7393* (2013.01); *H01L 21/02636* (2013.01); *H01L 29/0865* (2013.01); *H01L 29/0882* (2013.01); *H01L 29/1095* (2013.01); *H01L 29/417* (2013.01); *H01L 29/66325* (2013.01)

(58) Field of Classification Search
CPC ........... H01L 29/66681; H01L 29/7398; H01L 29/735; H01L 29/6625; H01L 29/7393; H01L 29/66325; H01L 29/0865; H01L 29/417; H01L 29/0882; H01L 21/02636; H01L 29/1095

See application file for complete search history.

(56) References Cited

U.S. PATENT DOCUMENTS

| | | | |
|---|---|---|---|
| 9,082,811 B2 | 7/2015 | Ward | |
| 2015/0318277 A1* | 11/2015 | Chang | ............... H01L 29/66348 257/140 |
| 2019/0363188 A1* | 11/2019 | You | ................... H01L 29/42368 |

OTHER PUBLICATIONS

"Office Action of Taiwan Counterpart Application", dated Dec. 3, 2020, p. 1-p. 3.

* cited by examiner

*Primary Examiner* — Mohammed R Alam
(74) *Attorney, Agent, or Firm* — JCIPRNET

(57) ABSTRACT

An insulated gate field effect bipolar transistor (IGFEBT) includes a substrate, a deep well (DW) region, a first conductivity type well region, a gate structure, a source region and a drain region located on the first conductivity type well region at both sides of the gate structure, an anode, and a cathode. The source region includes a first doped region and a second doped region between the first doped region and the gate structure, and the drain region includes a third doped region and a fourth doped region formed on the third doped region. The substrate, the first and fourth doped regions are of the first conductivity type, and the DW region, the second and the third doped regions are of a second conductivity type. The anode is electrically coupled to the fourth doped region, and the cathode is electrically coupled to the first and second doped regions.

21 Claims, 11 Drawing Sheets

INSULATED GATE FIELD EFFECT BIPOLAR TRANSISTOR AND MANUFACTURING METHOD THEREOF

CROSS-REFERENCE TO RELATED APPLICATION

This application claims the priority benefit of Taiwan application no. 109113504, filed on Apr. 22, 2020. The entirety of the above-mentioned patent application is hereby incorporated by reference herein and made a part of this specification.

BACKGROUND OF THE INVENTION

Field of the Invention

The invention relates to a semiconductor device and a manufacturing technique thereof, and in particular to an insulated gate field effect bipolar transistor and a manufacturing method thereof.

Description of Related Art

The insulated gate bipolar transistor (IGBT) is a power semiconductor device formed by one cathode short-circuited silicon-controlled rectifier (SCR) and one gold oxide half-field effect transistor (MOSFET) connecting an $n^+$ cathode to an $n^-$ substrate, and is commonly used in the output control of AC motors of electric vehicles, railway locomotives, and multiple units.

Common insulated gate bipolar transistors have two types of device designs, vertical and horizontal. However, at present, both vertical IGBT and lateral IGBT require a specific process for manufacture, and are not readily integrated into a general semiconductor process.

SUMMARY OF THE INVENTION

The invention provides an insulated gate field effect bipolar transistor that may electrically realize bipolar carrier transmission in the device structure of a unipolar field effect transistor (FET).

The invention also provides a manufacturing method of an insulated gate field effect bipolar transistor that may be integrated into an existing semiconductor manufacturing process, and a lateral insulated gate bipolar transistor is more compactly implemented in a MOSFET device structure.

An insulated gate field effect bipolar transistor of the invention includes a substrate, a deep well region formed in the substrate, a first conductivity type well region formed in the substrate above the deep well region, a gate structure formed on the substrate, a source region and a drain region located on the first conductivity type well region at both sides of the gate structure, an anode, and a cathode. The source region includes a first doped region and a second doped region between the first doped region and the gate structure, and the drain region includes a third doped region and a fourth doped region formed on the third doped region. The substrate and the first and fourth doped regions are of the first conductivity type, and the deep well region and the second and the third doped regions are of a second conductivity type. The anode is electrically coupled to the fourth doped region, and the cathode is electrically coupled to the first doped region and the second doped region.

In an embodiment of the invention, the first conductivity type is P-type, and the second conductivity type is N-type.

In an embodiment of the invention, the first conductivity type is N-type, and the second conductivity type is P-type.

In an embodiment of the invention, the first doped region and the fourth doped region may be ion implantation regions or epitaxial structures.

In an embodiment of the invention, the second doped region and the third doped region may be ion implantation regions or epitaxial structures.

In an embodiment of the invention, the drain region and the first conductivity type well region form a PNP bipolar transistor or an NPN bipolar transistor.

In an embodiment of the invention, the gate structure includes a gate, a gate insulating layer, and a plurality of spacers. The gate insulating layer is formed between the gate and the substrate, and the spacers are formed at sidewalls of the gate.

In an embodiment of the invention, the gate insulating layer includes an oxide layer, a high-k material layer, or a combination thereof.

In an embodiment of the invention, the gate includes a polysilicon or a metal.

In an embodiment of the invention, the insulated gate field effect bipolar transistor may further include a plurality of source/drain extension regions located in the substrate below the spacers, wherein the source/drain extension regions are of the second conductivity type.

In an embodiment of the invention, the insulated gate field effect bipolar transistor may further include a plurality of pocket doped regions respectively adjacent to the second doped region and the third doped region, wherein the pocket doped regions are of the first conductivity type.

In an embodiment of the invention, the substrate has a fin, the first conductivity type well region is formed at the fin, and the gate structure spans the fin.

A manufacturing method of an insulated gate field effect bipolar transistor of the invention includes forming isolation structures in a substrate of a first conductivity type to define at least one active region. Then, a deep well region of a second conductivity type is formed in the substrate, and a first conductivity type well region is formed in the substrate above the deep well region. A gate structure across the active region is formed at a surface of the substrate. A second doped region and a third doped region are respectively formed on the first conductivity type well region at both sides of the gate structure, wherein the second doped region and the third doped region are of the second conductivity type. Next, a selective epitaxial growth (SEG) is performed to form a first doped region on the first conductivity type well region outside the second doped region and form a fourth doped region on the third doped region, wherein the first doped region and the fourth doped region are of the first conductivity type. Then, an anode electrically coupled to the fourth doped region is formed, and a cathode electrically coupled to the first doped region and the second doped region is formed.

In another embodiment of the invention, a method of forming the second doped region and the third doped region includes an ion implantation method or another SEG.

In another embodiment of the invention, the step of forming the gate structure includes, after the first conductive well region is formed, forming a gate insulating layer at a surface of the substrate, forming a gate on the gate insulating layer, and forming a plurality of spacers at sidewalls at both sides of the gate.

In another embodiment of the invention, the gate insulating layer includes an oxide layer.

In another embodiment of the invention, before the spacers are formed, a plurality of source/drain extension regions may also be formed in the substrate at both sides of the gate.

In another embodiment of the invention, the step of forming the gate structure includes, after the first doped region and the fourth doped region are formed, forming an interlayer dielectric (ILD) layer at the surface of the substrate, forming an opening in the ILD layer, exposing the active region at which the gate structure is to be formed, depositing a gate insulating layer conformally in the opening, and forming a gate in the opening.

In another embodiment of the invention, the gate insulating layer includes a high-k material layer, and the gate includes a metal.

In another embodiment of the invention, after the second doped region and the third doped region are formed, a plurality of pocket doped regions may further be formed at facing sides of the second doped region and the third doped region, wherein the pocket doped regions are of the first conductivity type.

In another embodiment of the invention, before the isolation structures are formed, the substrate may be patterned to form at least one fin, and the active region is located in the fin.

Based on the above, in the invention, bipolar IGBT is integrated into the structure of MOSFET via structural design, and an equivalent circuit structure thereof is one bipolar transistor embedded at a drain of a field effect transistor (FET), wherein a collector of the bipolar transistor is only connected to the body of the FET. The above design may integrate the process of the insulated gate field effect bipolar transistor into an existing semiconductor manufacturing process and implement a lateral insulated gate bipolar transistor more compactly in a MOSFET device structure.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
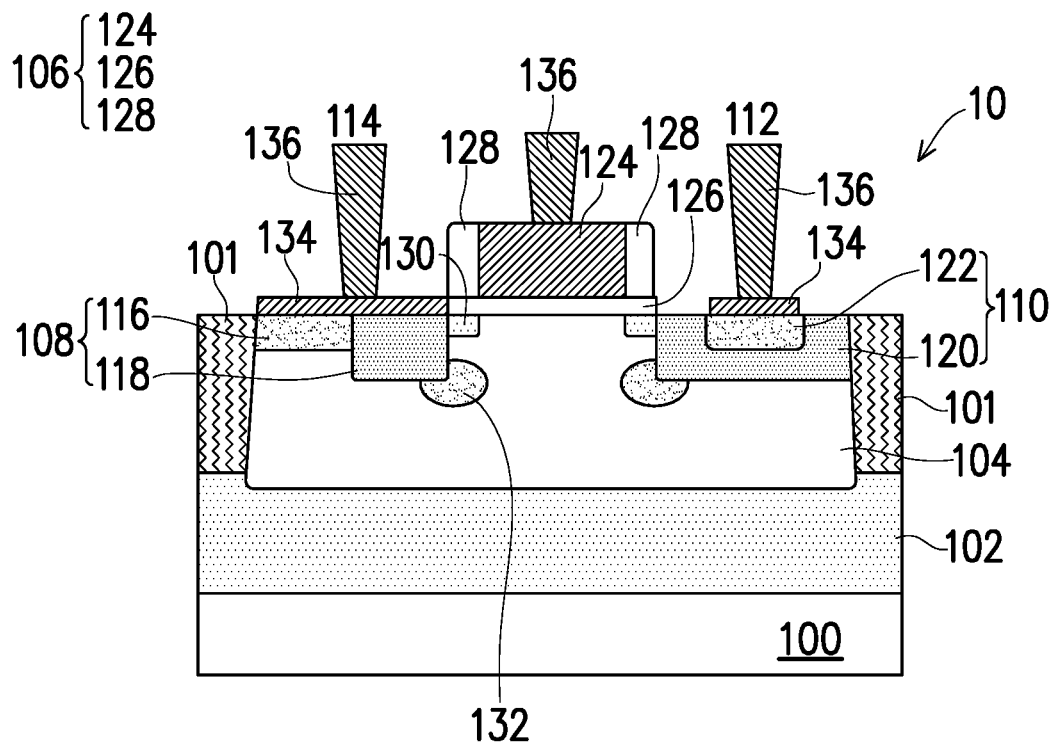
FIG. 1 is a cross-sectional view of an insulated gate field effect bipolar transistor according to the first embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals. Moreover, terms such as "contain", "include", and "have" used in the specification are all open terms, i.e., contains, but not limited to. Moreover, directional terms used in the specification such as "up" and "down" are only directions used in the figures. Therefore, the directional terms are used to illustrate and are not intended to limit the invention.

FIG. 1 is a cross-sectional view of an insulated gate field effect bipolar transistor according to the first embodiment of the invention.

Referring to FIG. 1, an insulated gate field effect bipolar transistor 10 includes a substrate 100, a deep well region 102 formed in the substrate 100, a first conductivity type well region 104 formed in the substrate 100 above the deep well region 102, a gate structure 106 formed on the substrate 100, a source region 108 located on the first conductivity type well region 104 at one side of the gate structure 106, a drain region 110 located on the first conductivity type well region 104 at another side of the gate structure 106, an anode 112, and a cathode 114. In an embodiment, an active region is defined by isolation structures 101 (such as STI), the deep well region 102 is extended under the isolation structures 101, and the first conductive well region 104 is located in the active region defined by the isolation structures 101. The source region 108 includes a first doped region 116 and a second doped region 118 between the first doped region 116 and the gate structure 106, and the drain region 110 includes a third doped region 120 and a fourth doped region 122 formed on the third doped region 120. In the present embodiment, the first doped region 116 and the fourth doped region 122 are ion implanted regions; and the second doped region 118 and the third doped region 120 are also ion implanted regions. In particular, the substrate 100, the first doped region 116, and the fourth doped region 122 are of the first conductivity type, and the deep well region 102, the second doped region 118, and the third doped region 120 are of a second conductivity type. In an embodiment, the first conductivity type is P-type, and the second conductivity type is N-type; in another embodiment, the first conductivity type is N-type, and the second conductivity type is P-type. Therefore, the drain region 110 and the first conductivity type well region 104 may form a PNP bipolar transistor or an NPN bipolar transistor, and the PNP bipolar transistor or NPN bipolar transistor may be formed via ion implantation. Alternatively, a homostructure or heterostructure bipolar transistor (such as SiGe HBT) may be formed via selective epitaxial growth (SEG).

In FIG. 1, the anode 112 is electrically coupled to the fourth doped region 122, and the cathode 114 is electrically coupled to the first doped region 116 and the second doped region 118. Therefore, the first doped region 116 and the second doped region 118 of different conductivity types are short-circuited with each other, and the first doped region 116 of the same conductivity type as the first conductivity type well region 104 may reduce resistance due to the higher doping concentration, so that electron holes are attracted here, thereby reducing the current flowing through the first conductivity type well region 104. In the case of an N-channel IGBT, such a circuit may reduce voltage drop at two ends of a conduction parasitic NPN transistor base-emitter, thus achieving the effect of inhibiting latch-up. The gate structure 106 may include a gate 124, a gate insulating layer 126 formed between the gate 124 and the substrate 100, and spacers 128 formed at the sidewalls of the gate 124, wherein the gate 124 is, for example, a polysilicon gate; and the gate insulating layer 126 may be an oxide layer, such as silicon oxide. In addition, a plurality of source/drain extension regions 130 may be disposed in the substrate 100 below the spacers 128, or a high voltage double diffused drain (DDD) may be used instead to increase breakdown voltage, wherein the source/drain extension regions 130 are of the second conductivity type. In addition, in order to effectively reduce leakage current and alleviate short channel effect, a plurality of pocket doped regions 132 may also be disposed below the channel, and the pocket doped regions 132 are respectively adjacent to the second doped region 118 and the third doped region 120, wherein the pocket doped regions 132 are of the first conductivity type. The anode 112 and the cathode 114 may generally form an electrically coupled link with a contact 136 formed subsequently via a metal silicide layer 134 formed at the surface of the source region 108 and formed at the surface of the fourth doped region 122 of the drain region 110.

Figure 2:
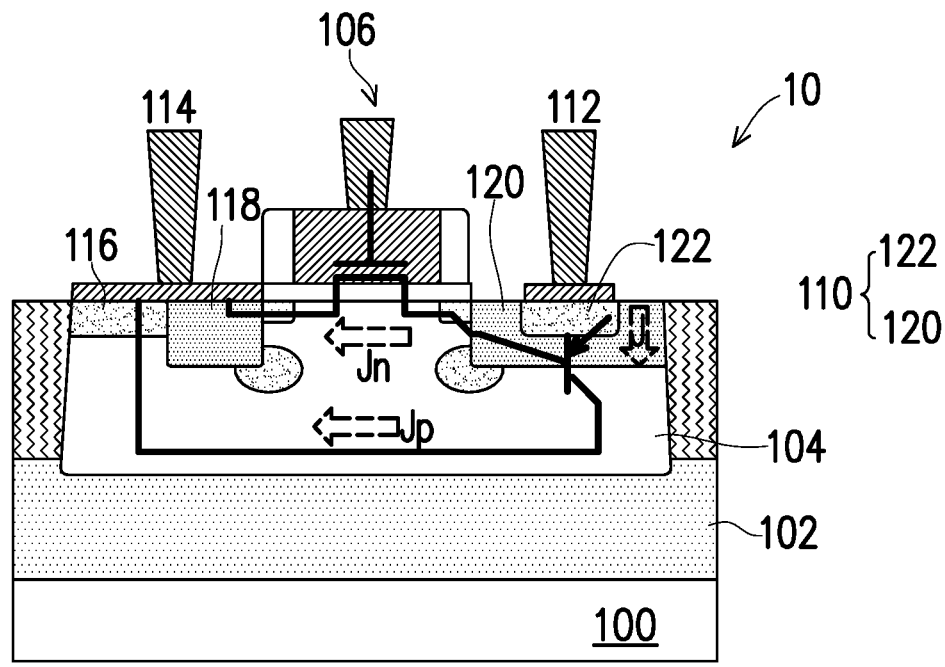
FIG. 2 is a view of the insulated gate field effect bipolar transistor of FIG. 1 attached with a circuit.

Moreover, in the case that an equivalent circuit is shown in the insulated gate field effect bipolar transistor 10 of the first embodiment, please refer to FIG. 2. In the case of an N-channel IGBT, the emitter and the PN diode of the PNP are the drain of the FET (the drain region 110), the PNP base is only connected to the FET channel, the PNP collector is only connected to the FET body (the first doped region 116), and the source of the FET (the second doped region 118) is short-circuited to the body. In the case of a P-channel IGBT, the emitter and the PN diode of the NPN are the drain of the FET, the NPN base is only connected to the FET channel, the NPN collector is only connected to the FET body, and the source of the FET is also short-circuited to the body.

In the case that the insulated gate field effect bipolar transistor 10 of the first embodiment is described from the carrier flow J viewpoint, unipolar and bipolar components are included, wherein the bipolar transistor (BJT) embedded in the drain region 110 makes the channel output of the unipolar field effect transistor (FET) equal to the base input of the bipolar junction transistor (FET channel output=BJT base input) when the EB (emitter and base) junction is in a forward bias and the BC (base and collector) junction is in a reverse bias. The collector of the bipolar junction transistor is shared with the base of the unipolar field effect transistor (BJT collector=FET body), and the source of the FET (the second doped region 118) and the body are short-circuited to inhibit latch-up effect. At this time, the FET functions as a polar filter separating an electron flow Jn from an electron hole flow Jp, so that the two flow into the channel and the body (the first doped region 116), respectively. If electrons flow through the FET, the electron holes are injected into the BJT base causing conductivity modulation, and vice versa.

Figure 3:
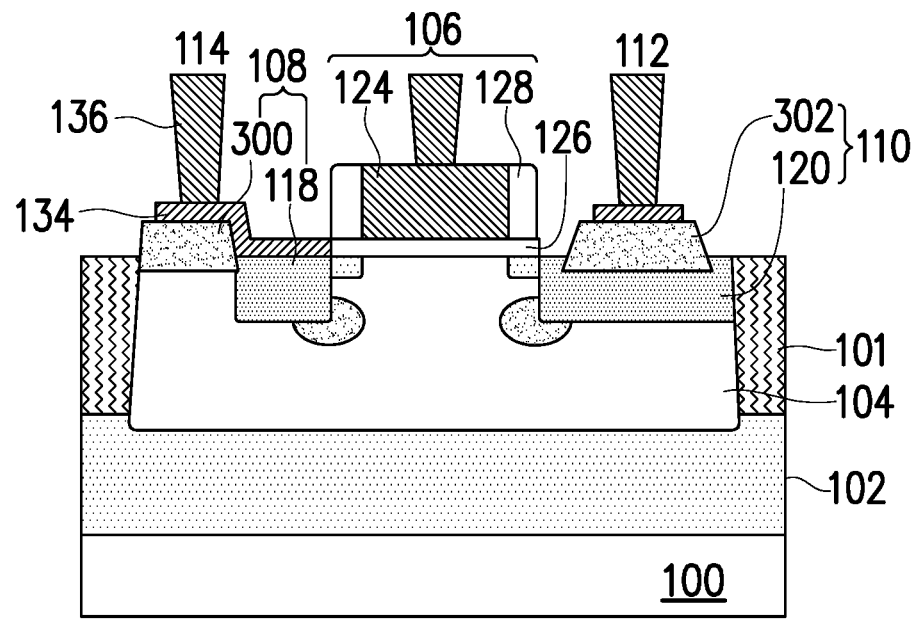
FIG. 3 is a cross-sectional view of an insulated gate field effect bipolar transistor according to the second embodiment of the invention.

FIG. 3 is a cross-sectional view of an insulated gate field effect bipolar transistor according to the second embodiment of the invention, wherein the same reference numerals as in the first embodiment are used to represent the same or similar components, and a portion of the technical descriptions omitted, such as the position, conductivity type, and material of each layer or region is as provided in the relevant content in the first embodiment and is therefore not repeated herein.

Referring to FIG. 3, the main difference between the present embodiment and the first embodiment is that a first doped region 300 and a fourth doped region 302 are homoepitaxial structures or heteroepitaxial structures formed by selective epitaxial growth (SEG). Therefore, the material of the first doped region 300 and the fourth doped region 302 includes silicon, silicon germanium (SiGe), and the like.

Figure 4:
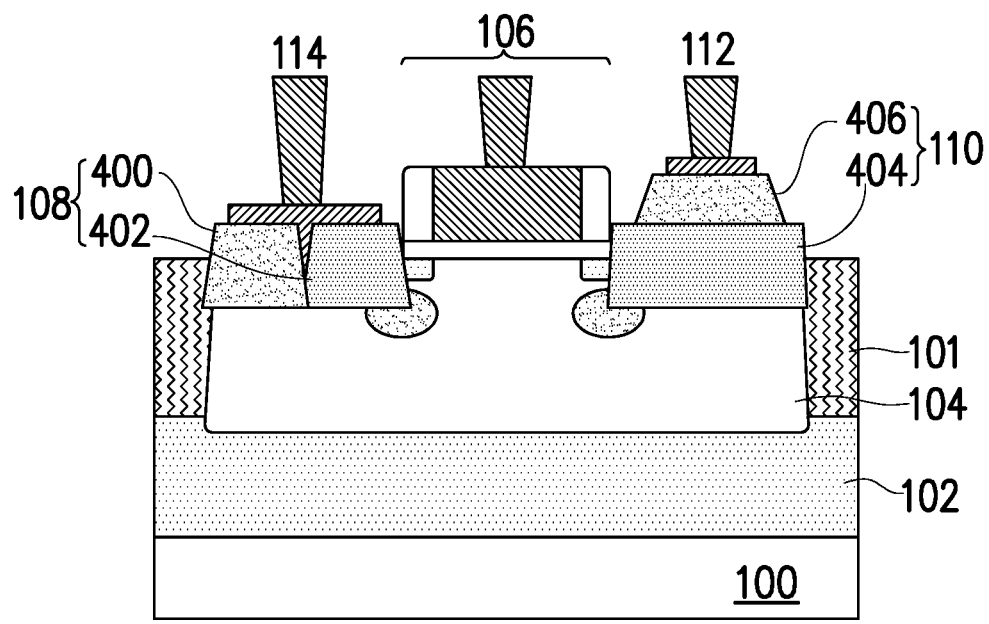
FIG. 4 is a cross-sectional view of an insulated gate field effect bipolar transistor according to the third embodiment of the invention.

FIG. 4 is a cross-sectional view of an insulated gate field effect bipolar transistor according to the third embodiment of the invention, wherein the same reference numerals as in the first embodiment are used to represent the same or similar components, and a portion of the technical descriptions omitted, such as the position, conductivity type, and material of each layer or region is as provided in the relevant content in the first embodiment and is therefore not repeated herein.

Please refer to FIG. 4. The main difference between the present embodiment and the first embodiment is that a first doped region 400 and a second doped region 402 of the source region 108 are both homoepitaxial structures or heteroepitaxial structures formed by selective epitaxial growth (SEG). Similarly, a third doped region 404 and a fourth doped region 406 of the drain region 110 are also homoepitaxial structures or heteroepitaxial structures formed by selective epitaxial growth (SEG). Therefore, the present embodiment may be integrated to a process of 40 nm or less.

Figure 5:
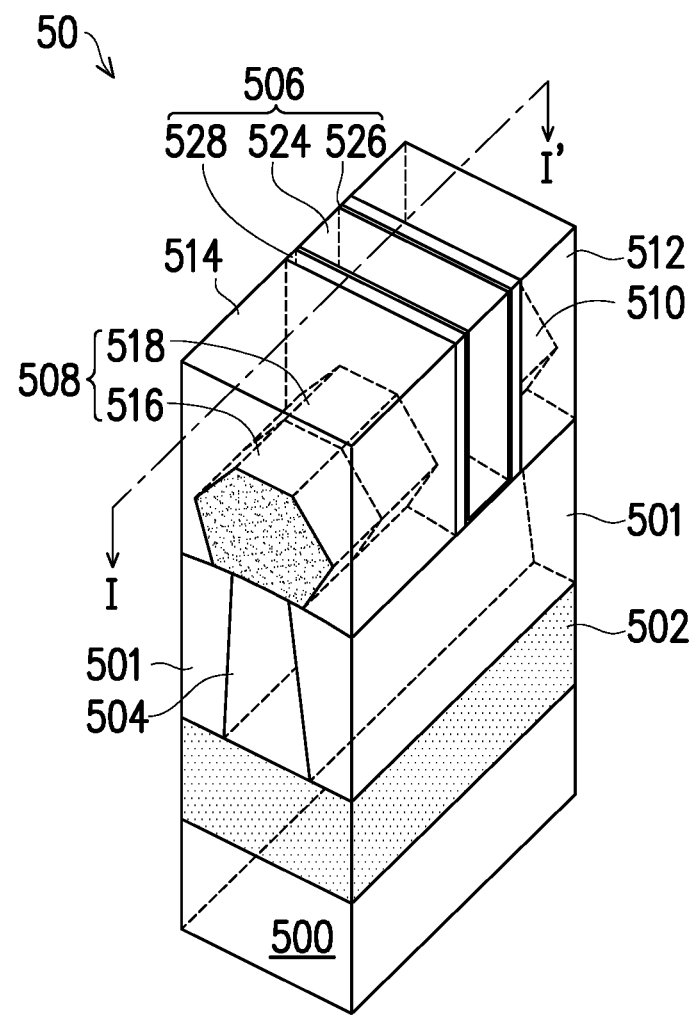
FIG. 5 is a perspective view of an insulated gate field effect bipolar transistor according to the fourth embodiment of the invention.
Figure 6:
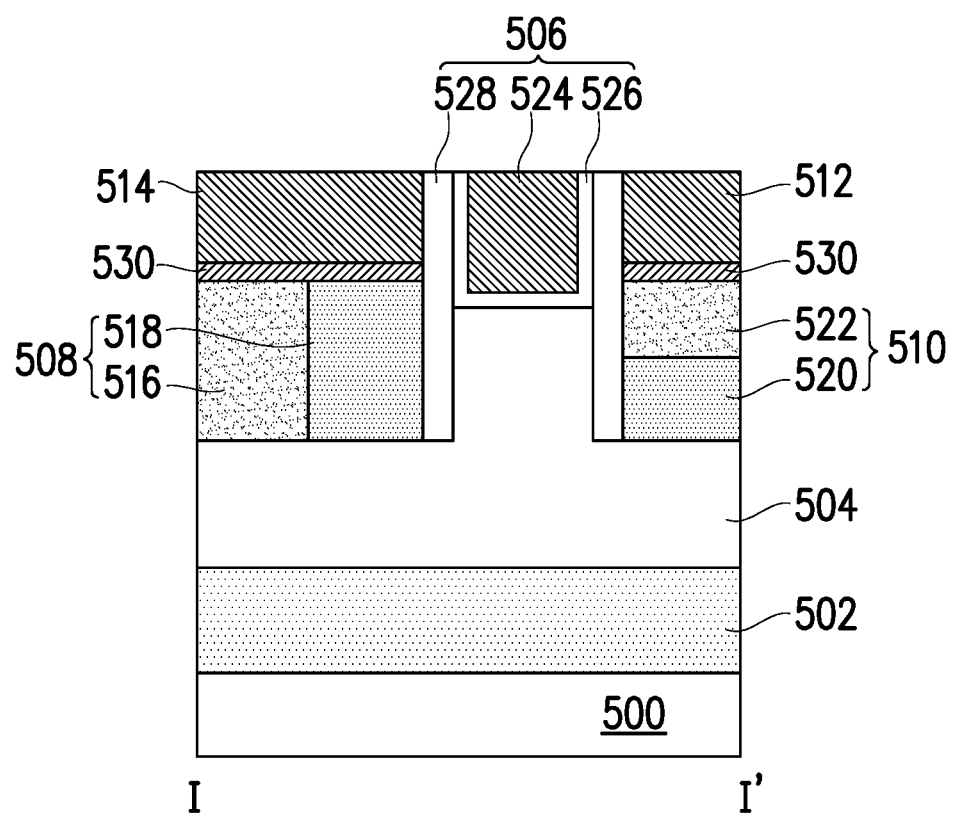
FIG. 6 is a cross-sectional view along section line I-I' of FIG. 5.

FIG. 5 is a perspective view of an insulated gate field effect bipolar transistor according to the fourth embodiment of the invention, wherein some components are not shown due to the perspective. FIG. 6 is a cross-sectional view along section line I-I' of FIG. 5.

Referring to FIG. 5 and FIG. 6, an insulated gate field effect bipolar transistor 50 is a structure in which a bipolar transistor is embedded in a FinFET architecture and includes a substrate 500, a deep well region 502 formed in the substrate 500, a first conductivity type well region 504 formed in the substrate 500 above the deep well region 502, a gate structure 506 formed on the substrate 500, a source region 508 located on the first conductivity type well region 504 at one side of the gate structure 506, a drain region 510 located on the first conductivity type well region 504 at another side of the gate structure 506, an anode 512, and a cathode 514. In FIG. 5, an active region is defined by via isolation structures 501 (such as STI), and the deep well region 502 is formed under the isolation structures 501. Therefore, the fin of the substrate 500 is where the first conductivity type well region 504 is formed, and the gate structure 506 spans the fin. The source region 508 includes a first doped region 516 and a second doped region 518 between the first doped region 516 and the gate structure 506, and the drain region 510 includes a third doped region 520 and a fourth doped region 522 formed on the third doped region 520. In the present embodiment, the first doped region 516, the second doped region 518, the third doped region 520, and the fourth doped region 522 are all epitaxial structures. In particular, the substrate 500, the first doped region 516, and the fourth doped region 522 are of the first conductivity type, and the deep well region 502, the second doped region 518, and the third doped region 520 are of a second conductivity type. In an embodiment, the first conductivity type is P-type, and the second conductivity type is N-type; in another embodiment, the first conductivity type is N-type, and the second conductivity type is P-type. Therefore, the drain region 510 and the first conductivity type well region 504 may form a PNP bipolar transistor or an NPN bipolar transistor, and the PNP bipolar transistor or NPN bipolar transistor is, for example, a homogeneous or heterostructure bipolar transistor (e.g., SiGe HBT) grown by selective epitaxial growth (SEG).

In FIG. 6, the anode 512 is electrically coupled to the fourth doped region 522, and the cathode 514 is electrically coupled to the first doped region 516 and the second doped region 518. Therefore, the first doped region 516 and the second doped region 518 of different conductivity types are short-circuited with each other, so as to inhibit latch-up. The gate structure 506 may include a gate 524, a gate insulating layer 526 formed between the gate 524 and the substrate 500, and spacers 528 formed at the sidewalls of the gate 524, wherein the gate 524 is, for example, a metal gate; the gate insulating layer 526 may be a high-k material layer or a combination of an oxide layer and a high-k material layer. The anode 552 and the cathode 514 may generally form an electrically coupled link via a metal silicide layer 530 formed at the surface of the source region 508 and formed at the surface of the fourth doped region 522 of the drain region 510. Therefore, the insulated gate field effect bipolar transistor 50 of the fourth embodiment also has an equivalent circuit as shown in FIG. 2.

FIG. 7A to FIG. 7G are manufacturing process steps of an insulated gate field effect bipolar transistor according to the fifth embodiment of the invention.

Figure 7A:
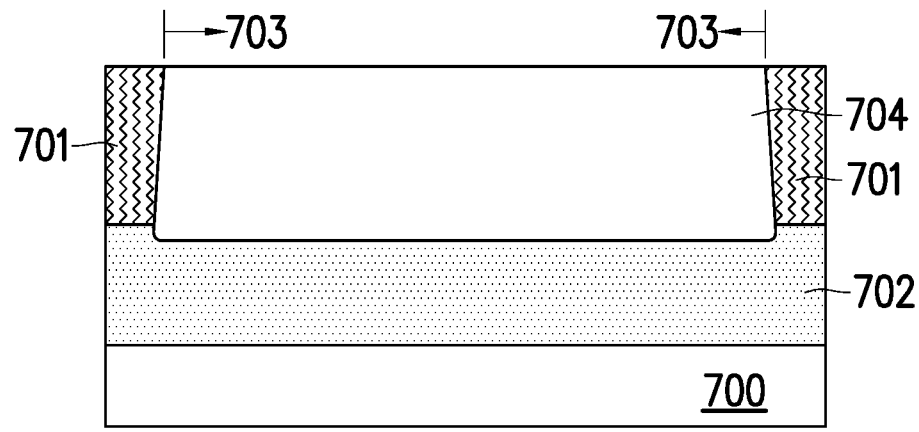
FIG. 7A to FIG. 7G are manufacturing process steps of an insulated gate field effect bipolar transistor according to the fifth embodiment of the invention.

Referring to FIG. 7A, isolation structures 701 are first formed in a substrate 700 of a first conductivity type to define at least one active region. Then, a deep well region 702 of a second conductivity type is formed in the substrate 700, and a first conductivity type well region 704 is formed in the substrate 700 above the deep well region 702. In an embodiment, the first conductivity type is P-type and the second conductivity type is N-type. In another embodiment, the second conductivity type is P-type and the first conductivity type is N-type.

Figure 7B:
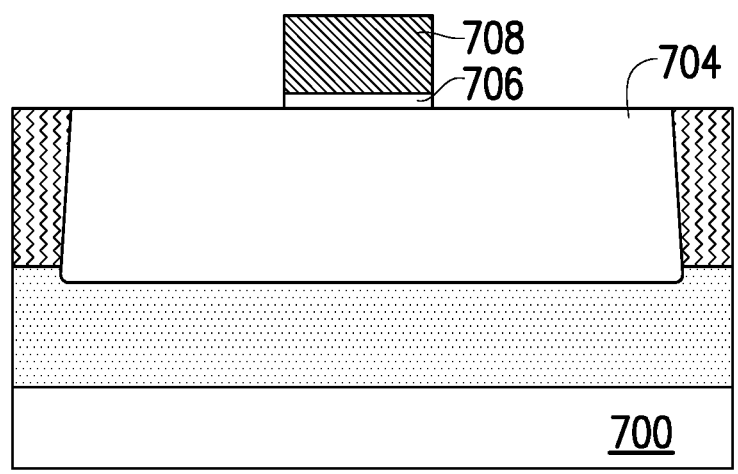

Next, referring to FIG. 7B, a gate-first process is performed to form a gate insulating layer 706 at the surface of the substrate 700, and then a gate 708 is formed on the gate insulating layer 706, wherein the gate insulating layer 706 is, for example, an oxide layer, and the gate 708 is, for example, a polysilicon gate.

Figure 7C:
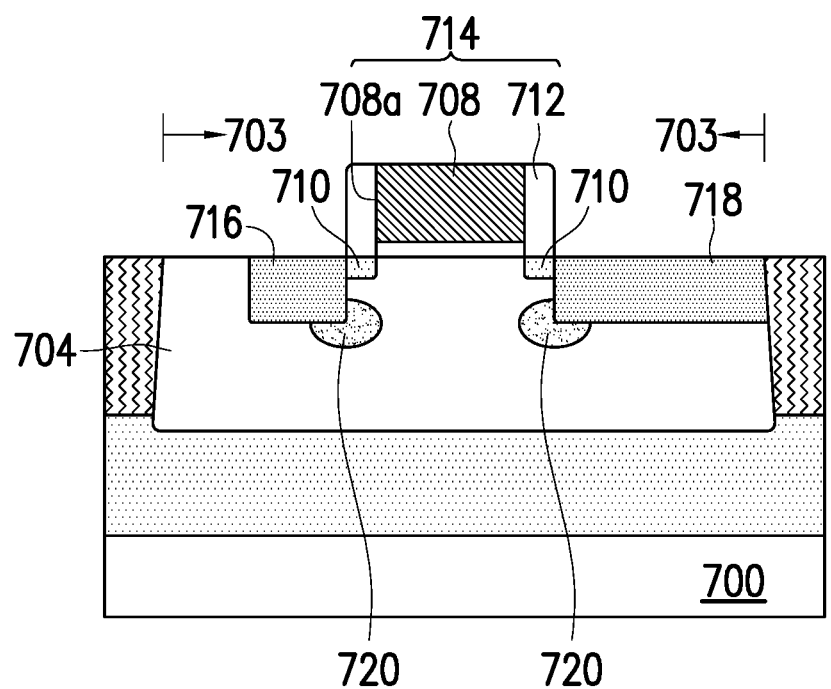

Then, referring to FIG. 7C, a plurality of source/drain extension regions 710 may be first formed in the substrate 700 at both sides of the gate 708, and then a plurality of spacers 712 may be formed at sidewalls 708a at both sides of the gate 708 to complete a gate structure 714 across the active region 703. Then, a second doped region 716 and a third doped region 718 are formed on the first conductivity type well region 704 at both sides of the gate structure 714 using ion implantation, wherein the second and third doped regions 716 and 718 are of the second conductivity type. In addition, a plurality of pocket doped regions 720 may be formed at facing sides of the second doped region 716 and the third doped region 718, and the pocket doped regions 720 are of the first conductivity type.

Figure 7D:
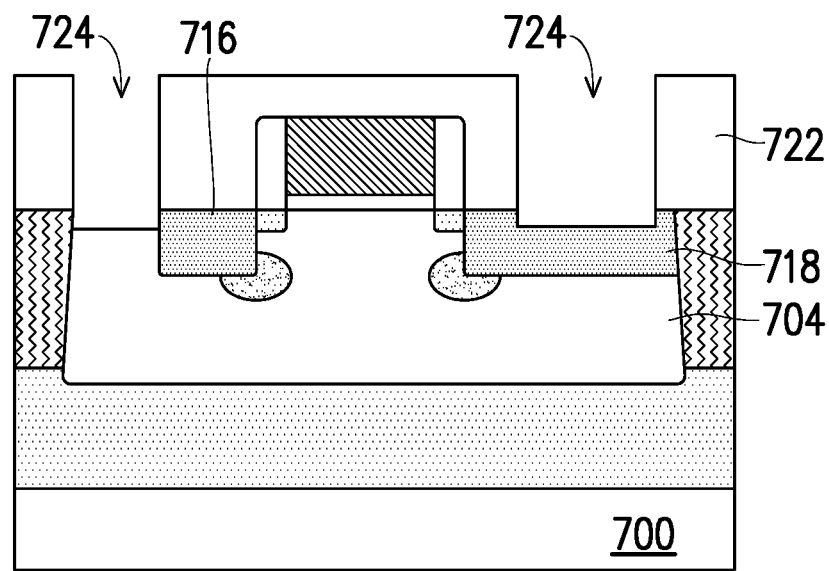

Next, referring to FIG. 7D, in order to perform selective epitaxial growth (SEG), a patterned mask 722 is first formed at the surface of the substrate 700, wherein there is an opening 724 exposing a portion of the substrate 700 at which an epitaxial structure is to be formed, and then a portion of the exposed substrate 700 (i.e., a portion of the first conductivity type well region 704 and a portion of the third doped region 718) is removed by etching.

Figure 7E:
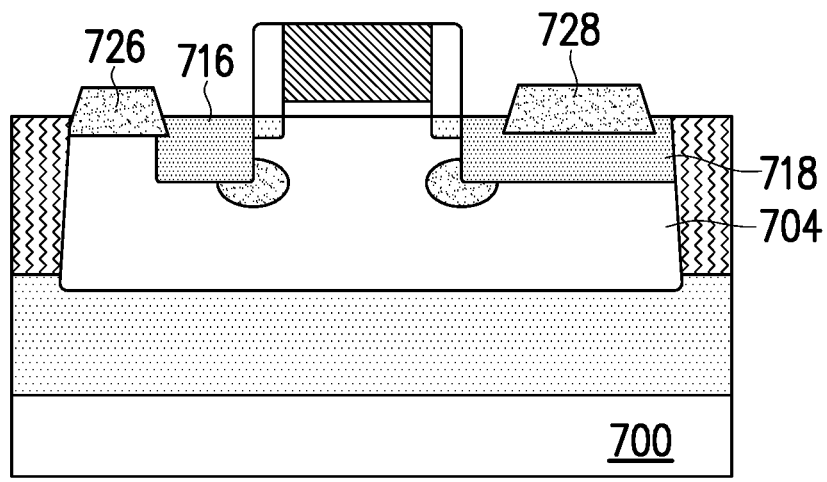

Then, referring to FIG. 7E, selective epitaxial growth (SEG) is performed to form a first doped region 726 on the first conductivity type well region 704 outside the second doped region 716 and form a fourth doped region 728 on the third doped region 718, wherein the first and fourth doped regions 726 and 728 are epitaxial structures of the first conductivity type, and the first and fourth doped regions 726 and 728 may be homostructures or heterostructures. Then, the mask 722 shown in FIG. 7D may be removed.

Figure 7F:
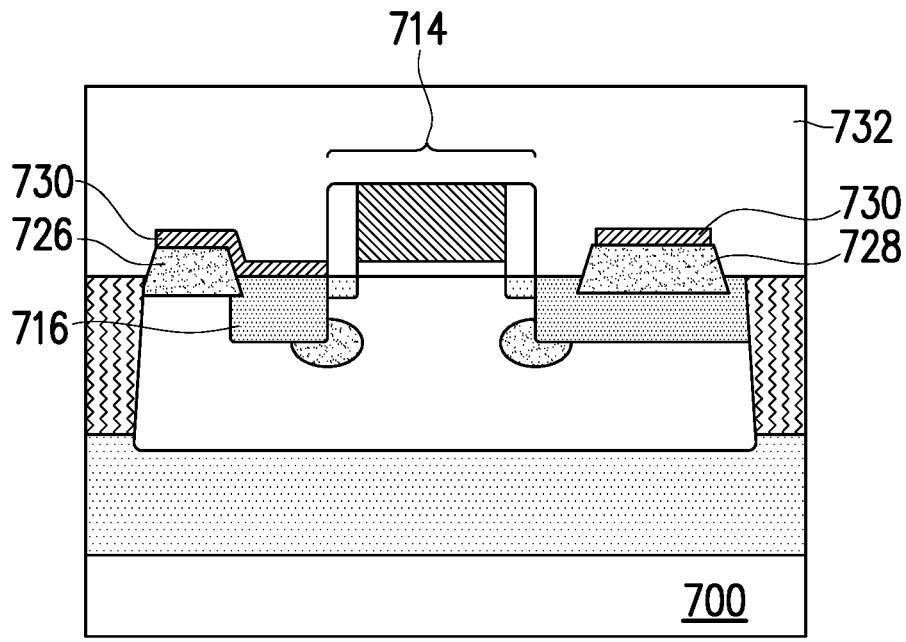

Next, please refer to FIG. 7F. For subsequent electrical connections, a metal silicide layer 730 may be formed at the surface of the fourth doped region 728, the surface of the first doped region 726, and the surface of the second doped region 716, and then an interlayer dielectric (ILD) layer 732 is deposited.

Figure 7G:
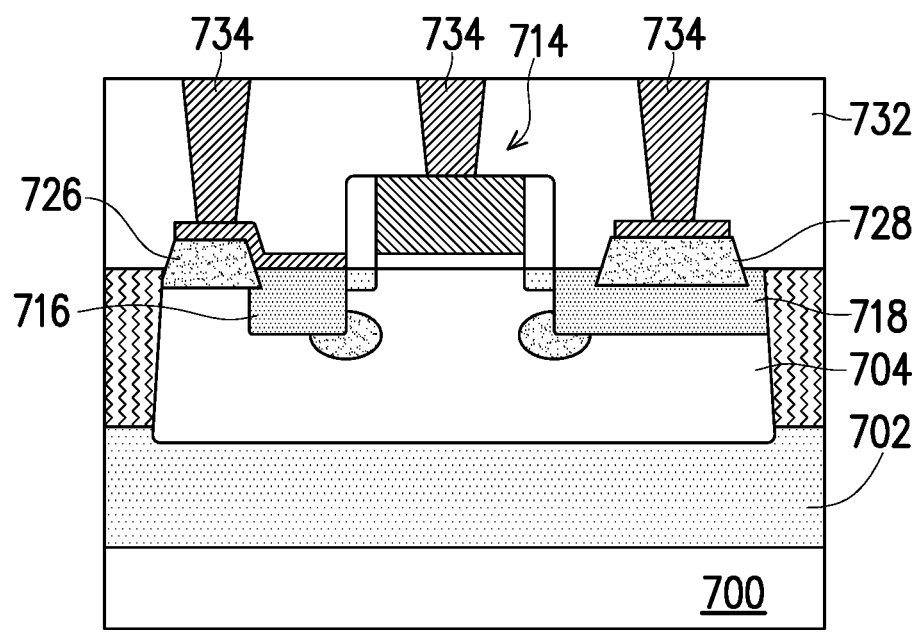

Then, referring to FIG. 7G, a contact 734 is formed in the ILD layer 732 to form an anode electrically coupled to the fourth doped region 728 and form a cathode electrically coupled to the first and second doped regions 726 and 716. Therefore, according to the fifth embodiment, an insulated gate field effect bipolar transistor similar to the second embodiment may be manufactured.

FIG. 8A to FIG. 8F are manufacturing process steps of an insulated gate field effect bipolar transistor according to the sixth embodiment of the invention, wherein the same reference numerals as in the fifth embodiment are used to represent the same or similar components, and a portion of the technical descriptions omitted, such as the position, conductivity type, and material of each layer or region is as provided in the relevant content in the fifth embodiment and is therefore not repeated herein.

Figure 8A:
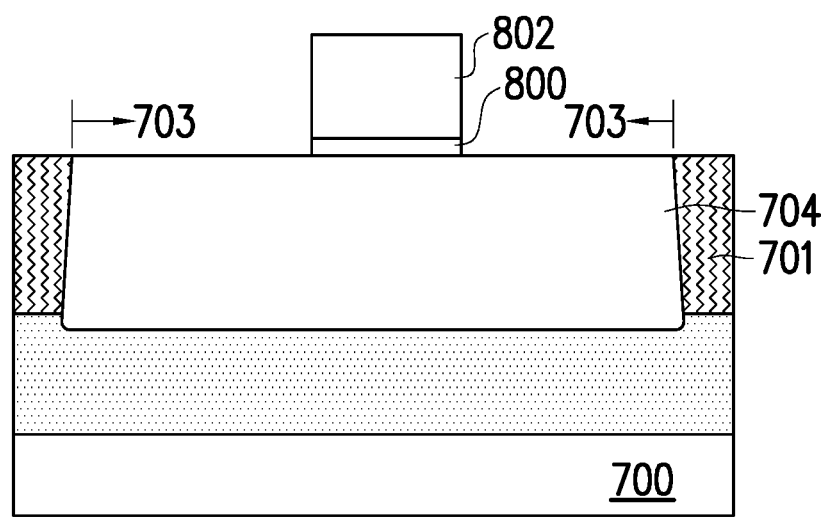
FIG. 8A to FIG. 8F are manufacturing process steps of an insulated gate field effect bipolar transistor according to the sixth embodiment of the invention.

Referring to FIG. 8A, the present embodiment is a gate-last process.

Therefore, after the first conductivity type well region 704 is formed, an intermediate layer 800 is formed at the surface of the substrate 700, and then a dummy gate 802 is formed on the intermediate layer 800, wherein the dummy gate 802 is, for example, polysilicon, and the intermediate layer 800 is a material layer that may increase the adhesion between the dummy gate 802 and the substrate 700, such as a silicon oxide layer. In addition, if an insulated gate field effect bipolar transistor as in the fourth embodiment is to be manufactured, before the isolation structures 701 are formed, the substrate 700 may be patterned first to form at least one fin, and the active region 703 is located in the fin.

Figure 8B:
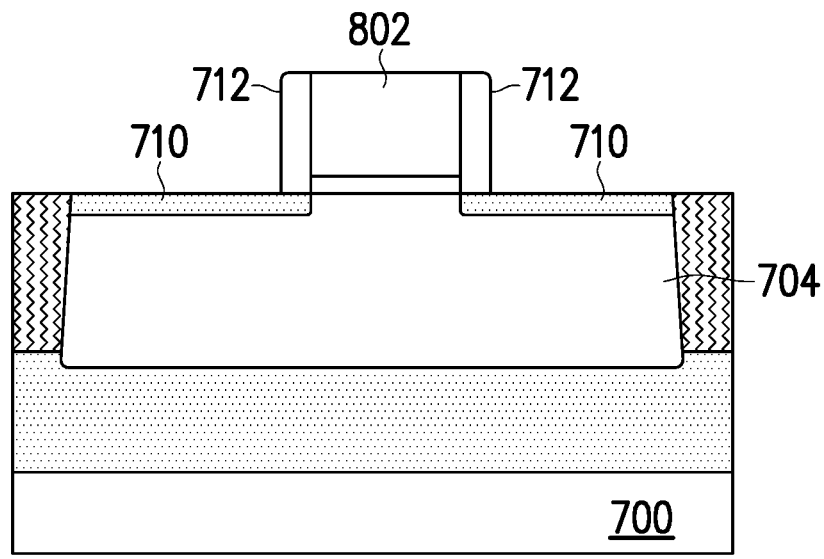

Then, referring to FIG. 8B, a plurality of source/drain extension regions 710 may be formed in the substrate 700 at both sides of the dummy gate 802 before the spacers 712 are formed.

Figure 8C:
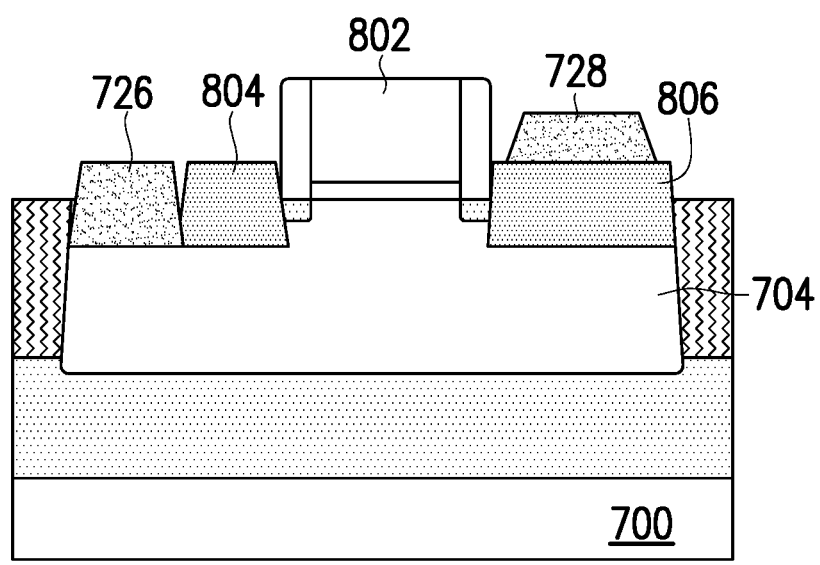

Next, referring to FIG. 8C, a second doped region 804 and a third doped region 806 and the first doped region 726 and the fourth doped region 728 are formed respectively using two selective epitaxial growth (SEG) processes. The second doped region 804 and the third doped region 806 are epitaxial structures of the second conductivity type, and may be homostructures or heterostructures.

Figure 8D:
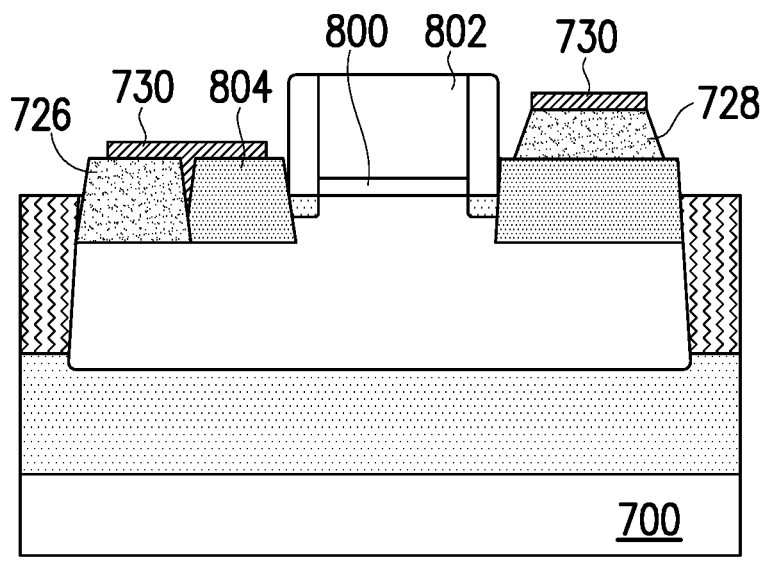

Next, please refer to FIG. 8D. For subsequent electrical connections, the metal silicide layer 730 may be formed at the surface of the fourth doped region 728, the surface of the first doped region 726, and the surface of the second doped region 804.

Figure 8E:
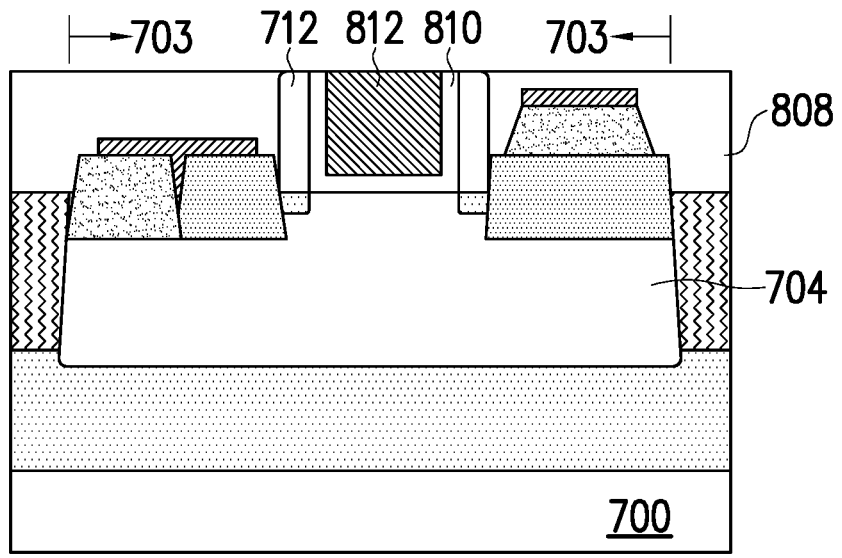

Then, referring to FIG. 8E, an interlayer dielectric (ILD) layer 808 is formed at the surface of the substrate 700, and the dummy gate 802 of FIG. 8D is exposed. Then, the dummy gate 802 and the intermediate layer 800 below are removed and an opening is formed in the ILD layer 808, exposing the active region 703 at which a gate structure is to be formed, then a gate insulating layer 810 is conformally deposited in the opening, and a gate 812 is formed in the opening, wherein the gate insulating layer 810 is, for example, a high-k material layer, and the gate 812 is, for example, a metal.

Figure 8F:
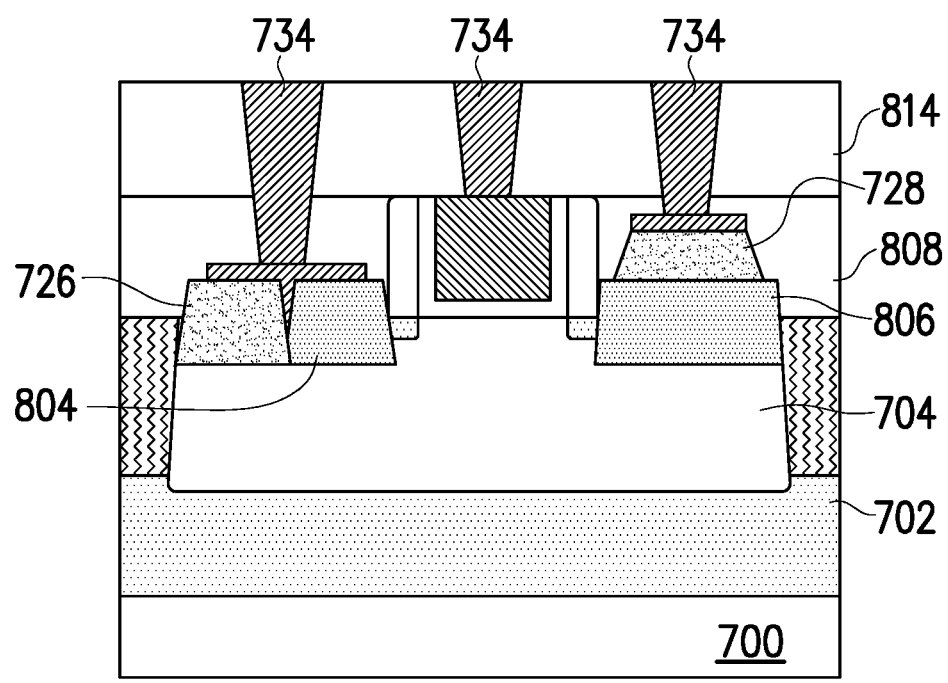

Next, referring to FIG. 8F, another ILD layer 814 is formed to cover the gate 812 and the ILD layer 808, and then the contact 734 is formed in the ILD layers 808 and 814 to form an anode electrically coupled to the fourth doped region 728 and form a cathode electrically coupled to the first and second doped regions 726 and 804. Therefore, according to the sixth embodiment, an insulated gate field effect bipolar transistor similar to the third or fourth embodiment may be manufactured.

Based on the above, in the invention, a bipolar IGBT is integrated into a MOSFET-like structure, so that the equivalent circuit may be a circuit in which one bipolar transistor is embedded in the drain terminal of the field effect transistor and the collector is only connected to the base of the FET. Therefore, the structure of the invention may not only implement a lateral insulated gate bipolar transistor more compactly in the device structure of the MOSFET, but may also integrate it into an existing semiconductor manufacturing process.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An insulated gate field effect bipolar transistor, comprising:
    a substrate of a first conductivity type;
    a deep well region formed in the substrate, wherein the deep well region is of a second conductivity type;
    a first conductivity type well region formed in the substrate above the deep well region;
    a gate structure formed on the substrate;
    a source region located on the first conductivity type well region at one side of the gate structure, wherein the source region comprises a first doped region and a second doped region between the first doped region and the gate structure, the first doped region is of the first conductivity type, and the second doped region is of the second conductivity type; and
    a drain region located on the first conductivity type well region at another side of the gate structure, wherein the drain region comprises a third doped region and a fourth doped region formed in the third doped region, the third doped region is of the second conductivity type, and the fourth doped region is of the first conductivity type;
    an anode electrically coupled to the fourth doped region; and
    a cathode electrically coupled to the first doped region and the second doped region.

2. The insulated gate field effect bipolar transistor of claim 1, wherein the first conductivity type is P-type, and the second conductivity type is N-type.

3. The insulated gate field effect bipolar transistor of claim 1, wherein the first conductivity type is N-type, and the second conductivity type is P-type.

4. The insulated gate field effect bipolar transistor of claim 1, wherein the first doped region and the fourth doped region comprise an ion implantation region or an epitaxial structure.

5. The insulated gate field effect bipolar transistor of claim 1, wherein the second doped region and the third doped region comprise an ion implantation region or an epitaxial structure.

6. The insulated gate field effect bipolar transistor of claim 1, wherein the drain region and the first conductivity type well region form a PNP bipolar transistor or an NPN bipolar transistor.

7. The insulated gate field effect bipolar transistor of claim 1, wherein the gate structure comprises:
    a gate;
    a gate insulating layer formed between the gate and the substrate; and
    a plurality of spacers formed at sidewalls of the gate.

8. The insulated gate field effect bipolar transistor of claim 7, wherein the gate insulating layer comprises an oxide layer, a high-k material layer, or a combination thereof.

9. The insulated gate field effect bipolar transistor of claim 7, wherein the gate comprises a polysilicon or a metal.

10. The insulated gate field effect bipolar transistor of claim 7, further comprising: a plurality of source/drain extension regions located in the substrate below the spacers, wherein the plurality of source/drain extension regions are of the second conductivity type.

11. The insulated gate field effect bipolar transistor of claim 1, further comprising: a plurality of pocket doped regions respectively adjacent to the second doped region and the third doped region, wherein the plurality of pocket doped regions are of the first conductivity type.

12. The insulated gate field effect bipolar transistor of claim 1, wherein the substrate has a fin, the first conductivity type well region is formed at the fin, and the gate structure spans the fin.

13. A manufacturing method of an insulated gate field effect bipolar transistor, comprising:
    forming isolation structures in a substrate of a first conductivity type to define at least one active region;
    forming a deep well region of a second conductivity type in the substrate;
    forming a first conductivity type well region in the substrate above the deep well region;
    forming a gate structure across the active region at a surface of the substrate;
    forming a second doped region and a third doped region respectively on the first conductivity type well region at both sides of the gate structure, wherein the second doped region and the third doped region are of the second conductivity type;
    performing selective epitaxial growth (SEG) to form a first doped region on the first conductivity type well region outside the second doped region and form a fourth doped region on the third doped region, wherein the first doped region and the fourth doped region are of the first conductivity type;
    forming an anode electrically coupled to the fourth doped region; and
    forming a cathode electrically coupled to the first doped region and the second doped region.

14. The manufacturing method of the insulated gate field effect bipolar transistor of claim 13, wherein a method of forming the second doped region and the third doped region comprises an ion implantation method or another SEG.

15. The manufacturing method of the insulated gate field effect bipolar transistor of claim 13, wherein the step of forming the gate structure comprises:
  forming a gate insulating layer at a surface of the substrate after the first conductivity type well region is formed;
  forming a gate on the gate insulating layer; and
  forming a plurality of spacers at sidewalls at both sides of the gate.

16. The manufacturing method of the insulated gate field effect bipolar transistor of claim 15, wherein the gate insulating layer comprises an oxide layer.

17. The manufacturing method of the insulated gate field effect bipolar transistor of claim 15, further comprising, before the spacers are formed, forming a plurality of source/drain extension regions in the substrate at both sides of the gate, wherein the plurality of source/drain extension regions are of the second conductivity type.

18. The manufacturing method of the insulated gate field effect bipolar transistor of claim 13, wherein the step of forming the gate structure comprises:
  forming an interlayer dielectric (ILD) layer at the surface of the substrate after the first doped region and the fourth doped region are formed;
  forming an opening in the ILD layer to expose the active region at which the gate structure is to be formed;
  depositing a gate insulating layer conformally in the opening; and
  forming a gate in the opening.

19. The manufacturing method of the insulated gate field effect bipolar transistor of claim 18, wherein the gate insulating layer comprises a high-k material layer, and the gate comprises a metal.

20. The manufacturing method of the insulated gate field effect bipolar transistor of claim 13, further comprising, after the second doped region and the third doped region are formed, forming a plurality of pocket doped regions at facing sides of the second doped region and the third doped region, wherein the pocket doped regions are of the first conductivity type.

21. The manufacturing method of the insulated gate field effect bipolar transistor of claim 13, further comprising, before the isolation structures are formed, patterning the substrate to form at least one fin, wherein the active region is located in the fin.

* * * * *